United States Patent
Athanikar et al.

(10) Patent No.: US 12,067,233 B2
(45) Date of Patent: Aug. 20, 2024

(54) METHOD AND SYSTEM FOR TUNING A MEMORY DEVICE FOR HIGH-SPEED TRANSITIONS

(71) Applicant: SAMSUNG ELECTRONICS CO., LTD., Suwon-si (KR)

(72) Inventors: Shankar Athanikar, Bengaluru (IN); Akhilesh Kumar Jaiswal, Bengaluru (IN); Puneet Kukreja, Bengaluru (IN); Sumeet Paul, Bengaluru (IN); Vinay Kumar M N, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

(21) Appl. No.: 17/933,944

(22) Filed: Sep. 21, 2022

(65) Prior Publication Data

US 2024/0020000 A1  Jan. 18, 2024

(30) Foreign Application Priority Data

Jul. 14, 2022 (IN) .............................. 202241040285

(51) Int. Cl.
*G06F 3/06* (2006.01)
(52) U.S. Cl.
CPC .......... *G06F 3/0604* (2013.01); *G06F 3/0613* (2013.01); *G06F 3/064* (2013.01); *G06F 3/0679* (2013.01)
(58) Field of Classification Search
CPC ...... G06F 3/0604; G06F 3/0613; G06F 3/064; G06F 3/0679
See application file for complete search history.

(56) References Cited

U.S. PATENT DOCUMENTS

| 5,710,910 A | 1/1998 | Kehl et al. |
| 8,351,885 B2 | 1/2013 | Dubash et al. |

(Continued)

FOREIGN PATENT DOCUMENTS

| EP | 0455046 | 11/1991 |
| EP | 1446910 | 8/2004 |

OTHER PUBLICATIONS

Yu, Zhibin, Zhendong Bei, and Xuehai Qian. "Datasize-aware high dimensional configurations auto-tuning of in-memory cluster computing." Proceedings of the Twenty-Third International Conference on Architectural Support for Programming Languages and Operating Systems. 2018. (Year: 2018).*

(Continued)

*Primary Examiner* — Nicholas J Simonetti
(74) *Attorney, Agent, or Firm* — F. Chau & Associates, LLC

(57) ABSTRACT

The present disclosure relates to a method and system for tuning a memory device for high-speed transitions. Upon failure of bus sampling tuning of a memory device with default tuning parameters, the host device is configured to transmit an auto-tuning request to the memory device for until one or more pre-defined conditions are satisfied. The memory device is configured to receive the auto-tuning request from the host device, selects a set of tuning parameters from a plurality of sets of tuning parameters, and transmits a tuning block to the host device based on the selected set of tuning parameters, until one or more pre-defined conditions are satisfied. Thereby, the memory device can utilize high-speed mode and high-speed transitions can be achieved between host and memory devices. Thus, initialization failure of the memory device can also be avoided.

20 Claims, 5 Drawing Sheets

(56) References Cited

U.S. PATENT DOCUMENTS

| | | |
|---|---|---|
| 9,430,423 B2 | 8/2016 | Yoo et al. |
| 9,772,651 B2* | 9/2017 | Lee .......................... G06F 1/12 |
| 10,057,866 B2 | 8/2018 | Cho et al. |
| 2006/0077711 A1* | 4/2006 | Mylly .................... G11C 16/12 |
| | | 365/185.17 |
| 2014/0082404 A1* | 3/2014 | Kang ....................... G06F 1/10 |
| | | 713/503 |
| 2017/0162276 A1* | 6/2017 | Ok .......................... G11C 29/36 |
| 2022/0236912 A1* | 7/2022 | Zeleniak ............... G06F 3/0653 |
| 2024/0045798 A1* | 2/2024 | Hsieh ................... G11C 7/1063 |

OTHER PUBLICATIONS

Munegowda, Keshava, G. T. Raju, and Veera Maninkandanraju. "Adapting Endurance and Performance Optimization Strategies of ExFAT file system to FAT file system for embedded storage devices." International Journal of Engineering and Technology 6.1 (2014): 204-211. (Year: 2014).*

* cited by examiner

FIG. 2B

| | | | EXT_CSD register Example | | | | |
|---|---|---|---|---|---|---|---|
| BIT 7 | BIT 6 | BIT 5 | BIT 4 | BIT 3 | BIT 2 | BIT 1 | BIT 0 |
| Possible combination of OD/DS | | | | | | ENABLE AUTO TUNING | AUTO_TUNINIG_SUPPORT |
| R | | | | | | R/W | R |

METHOD AND SYSTEM FOR TUNING A MEMORY DEVICE FOR HIGH-SPEED TRANSITIONS

CROSS-REFERENCE

This application claims priority under 35 U.S.C. § 119 to Indian Patent Application No. 202241040285, filed on Jul. 14, 2022 in the Indian Intellectual Property Office, the disclosure of which is incorporated by reference herein in its entirety.

FIELD

The present disclosure generally relates to memory devices, and more particularly but non-exclusively relates to a method and apparatus for tuning a memory device for high-speed transitions.

DISCUSSION

Generally, a memory or storage device such as an embedded multi-media card (eMMC), a Secure Digital (SD) card, or a micro-SD card may be used to store multimedia data. As System-On-Chip (SOC) hosts are advancing to higher speeds in this era, such underlying memory or storage devices e.g., are also advancing to operate at higher frequencies for faster data transfers. As transmission frequency is rapidly increasing, there may be a correspondingly increasing possibility of synchronization issues between a host device and a memory device. In order to address such synchronization issues, some specifications may provide tuning algorithms to find a valid synchronization window between host and memory devices where data may be sampled at appropriate points. Even though such algorithms may be used, tuning mis-matches may occur due to various environmental conditions (e.g., temperature) and/or silicon characteristics. When a tuning mis-match occurs, then the host may i) successfully switch to a lower speed mode and initialize a slave memory device in the lower speed mode, or ii) fail to switch to a lower speed mode and/or fail to initialize the slave memory device in the lower speed mode leading to memory device initialization failure. That is, the host device may operate in the lower speed mode in cooperation with the memory device, or it may substantially disconnect from and/or not use the memory device.

Embodiments of the present disclosure may generate a model that enables the memory device to select tuning parameters, and with these selected tuning parameters a tuning process may be retried by the host device to achieve high-speed data transfer between the host device and the memory device.

The information disclosed in this section is offered to enhance understanding of the inventors' own progress, and shall not be taken as an acknowledgment nor suggestion as to whether or not such information was previously published or might otherwise comprise prior art or exceptions thereto.

SUMMARY

Embodiments may be realized through the described apparatus and/or techniques of the present disclosure. These and other embodiments of the present disclosure may be described in detail herein and/or derived based on a combined understanding of the teachings disclosed herein.

In an embodiment, the present disclosure provides a method of tuning a memory device for high-speed transitions. The method may be performed by the memory device. Upon failure of bus sampling tuning of the memory device with default tuning parameters, the method comprises receiving an auto-tuning request from a host device, selecting a set of tuning parameters from a plurality of sets of tuning parameters, and/or transmitting a tuning block to the host device using a bus based on the selected set of tuning parameters, for tuning the memory device for high-speed transitions, iteratively until one or more pre-defined conditions are satisfied.

In an embodiment, the present disclosure provides a memory device. The memory device comprises at least one non-volatile flash memory unit and a processor. Upon failure of bus sampling tuning of a memory device with default tuning parameters, the processor is configured to receive an auto-tuning request from a host device, select a set of tuning parameters from a plurality of sets of tuning parameters, and/or transmit a tuning block to the host device using the bus based on the selected set of tuning parameters for tuning the memory device for high-speed transitions, iteratively until one or more pre-defined conditions are satisfied.

In an embodiment, the present disclosure provides a system for tuning a memory device for high-speed transitions. The system comprises a memory device and a host device. Upon failure of bus sampling tuning of a memory device with default tuning parameters, the host device is configured to transmit an auto-tuning request to the memory device until one or more pre-defined conditions are satisfied. The memory device is configured to receive the auto-tuning request from the host device until one or more pre-defined conditions are satisfied. The memory device is configured to select a set of tuning parameters from a plurality of sets tuning parameters, until one or more pre-defined conditions are satisfied. The memory device is further configured to transmit a tuning block to the host device using the bus based on the selected set of tuning parameters, for tuning the memory device for high-speed transitions, until one or more pre-defined conditions are satisfied.

The foregoing summary is illustrative in nature and not intended to be in any way limiting. In addition to the illustrative embodiments described above, further embodiments may become apparent by reference to the accompanying drawings and the following detailed description.

BRIEF DESCRIPTION OF THE DRAWINGS

Elements of the disclosure may be set forth in the appended claims. The disclosure itself, however, such as an illustrative and/or preferred mode of use, may be understood by reference to the following detailed description of an illustrative embodiment when read in conjunction with the accompanying drawings. The accompanying drawings, which are incorporated in and constitute a part of this disclosure, show embodiments for illustrative rather than limiting purposes, and, together with the description, serve to explain the disclosed principles. In the figures, the leftmost digit(s) of a reference number may identify the figure number in which the reference number first appears. One or more embodiments are now described, by way of example with reference to the accompanying drawings wherein like reference numerals may represent like elements, in which:

FIG. 2b is a tabular diagram that illustrates a structure of an Extended Card-Specific Data (EXT_CSD) register or Card-Specific Data (CSD) register in accordance with an embodiment of the present disclosure;

Figure 1:
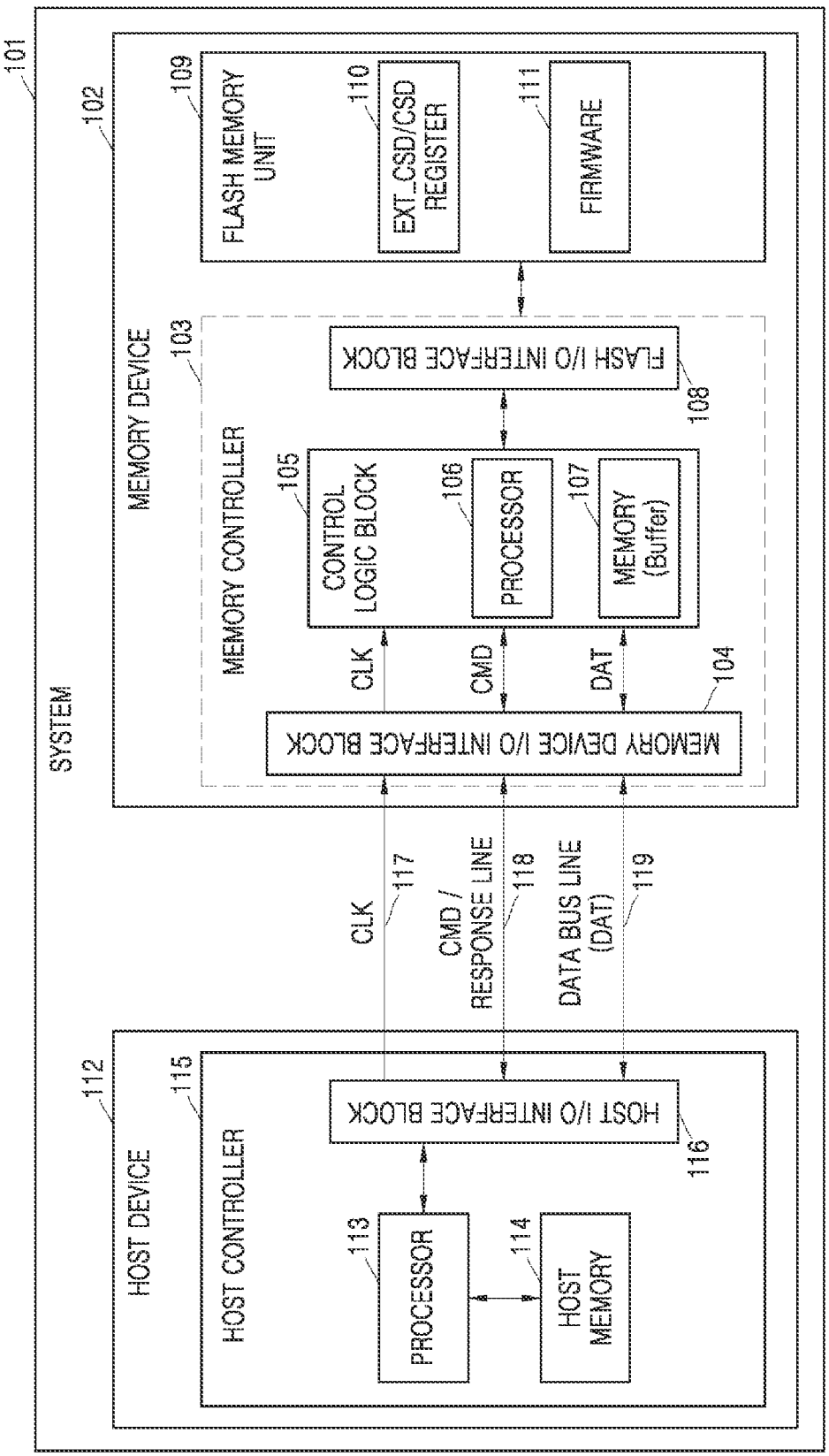
FIG. 1 is a block diagram that shows an environment of a system for tuning a memory device for high-speed transitions in accordance with an embodiment of the present disclosure.

It may be appreciated by those skilled in the art that any block diagrams herein may represent conceptual views of illustrative systems embodying the principles of the present disclosure. Similarly, it may be appreciated that any flow charts, flow diagrams, state transition diagrams, pseudo code, or the like may represent various processes which may be substantially represented in a computer readable medium and executed by a computer or processor, whether or not such computer or processor is explicitly shown.

DETAILED DESCRIPTION

In the present document, the word "exemplary" may be used to mean "serving as an example, instance, or illustration." Any embodiment or implementation of the present subject matter described herein as "exemplary" is not necessarily to be construed as preferred or advantageous over any other embodiments.

While the disclosure is susceptible to various modifications and alternative forms, a specific embodiment thereof has been shown by way of example in the drawings and may be described in detail below. It should be understood, however that there is no intention to limit the disclosure to the particular forms disclosed, but on the contrary, the disclosure is intended to cover all modifications, equivalents, and alternatives falling within the scope of the disclosure.

In the following detailed description of embodiments, reference is made to the accompanying drawings that form a part hereof, and in which are shown by way of illustration specific embodiments in which the teachings of the disclosure may be practiced. These embodiments are described in sufficient detail to enable those skilled in the art to practice the invention, and it is to be understood that other embodiments may be utilized and that changes may be made without departing from the scope of the present disclosure. The following description is, therefore, not to be taken in a limiting sense.

The present disclosure relates to a method and system for tuning a memory device for high-speed transitions. Upon failure of bus sampling tuning of a memory device with default tuning parameters, the host device is configured to transmit an auto-tuning request to the memory device until one or more pre-defined conditions are satisfied. The memory device is configured to receive the auto-tuning request from the host device, select a set of tuning parameters from a plurality of sets tuning parameters, and transmit a tuning block to the host device based on the selected set of tuning parameters for tuning the memory device for high-speed transitions, until one or more pre-defined conditions are satisfied. Thereby, the memory device may be utilized for high-speed mode, and high-speed transitions may be achieved between host and memory devices. Thus, a situation may be avoided where the host device might otherwise fail to initialize the memory device.

For convenience of description, Table A summarizes reference indicia as may be used herein, without limitation thereto:

TABLE A

| Reference number | Description |
| --- | --- |
| 100 | Illustrative Environment |
| 101 | System |
| 102 | Memory Device |
| 103 | Memory Controller |
| 104 | Memory Device I/O Interface Block |
| 105 | Control Logic Block |
| 106 | Processor |
| 107 | Memory or Buffer |
| 108 | Flash I/O Interface Block |
| 109 | At Least One Non-Volatile Flash Memory Unit |
| 110 | EXT_CSD/CSD Register |
| 111 | Firmware |
| 112 | Host Device |
| 113 | Processor |
| 114 | Host Memory |
| 115 | Host Controller |
| 116 | Host I/O Interface Block |
| 117 | Clock Line |
| 118 | Common Line |
| 119 | Data Bus Line |

FIG. 1 shows an illustrative environment (100) of a system (101) for tuning a memory device (102) for high-speed transitions, in accordance with an embodiment of the present disclosure.

The environment (100) comprises the system (101). The system (101) may be a smartphone, a laptop or other portable computer, a desktop computer, a Personal Computer (PC), a notebook, a tablet, a wearable device, a healthcare device, an Internet of things (IOT) device, or the like. The system (101) comprises a memory device (102) and a host device (112). The memory device (102) is a storage device. In an embodiment, the memory device (102) may either be an integral part of the system (101) or may be stand-alone part. For example, the memory device (102) may be an embedded Multi-Media Card (eMMC), a secured Digital (SD) card, or a micro-SD card. In an embodiment, the memory device (102) may be variously connected with the host device (112) via a number of connections, channels or signal paths implemented by one or more components such as pin(s), line(s), and bus(es). The line(s) may include a command line, a response line, a clock line (117), and a data bus line (119) or bus. The bus (es) may be a data bus. In an embodiment, a common line (118) may be configured as both the command line and the response line.

The host device (112) may include a host controller (115). The host controller (115) comprises a processor (113), and a host memory (114). The processor (113) of the host device (112) may be implemented as a general-purpose processor, a dedicated processor, an application processor or the like. Additionally, a host-resident operating system (OS) or firmware may be used by the processor (113) to drive data/address/command/control signals to the memory device (102). The host device (112) may include a clock generator. The clock generator may be used to generate a "clock" signal CLK used as a reference clock signal in the host device (112) and/or in the memory device (102) via the clock line (117).

The memory device (102) is routinely provided with the clock signal CLK over the clock line (117) by the host device (112). A frequency of the reference clock signal or CLK signal provided from the host device (112) to the memory device (102) may be one of 25 MHz, 26 MHz, 50 MHz, 52 MHz, 200 MHz, without being limited thereto. The host device (112) may change the frequency of the clock signal CLK during an operation, such as during data transmission/receiving operations between the host device (112) and the memory device (102). The host device (112) may set a data rate between the host device (112) and the memory device (102) by using the frequency of the reference clock signal CLK. That is, the data rate may be determined depending on the frequency of the reference clock signal CLK.

The host memory (114) may be a volatile memory. The volatile memory may be Static Random-Access Memory (SRAM), Dynamic RAM (DRAM) or the like. The host memory (114) may be used by the processor (113) to perform one or more operations such as boot operations, post-boot operations, or the like. The boot operations may include loading the operating system into the host memory (114) from a non-volatile memory of the host device (112) when the host device (112) boots. The post-boot operations may include a read operation, write operation, erase operation, debug operation, and the like. In an embodiment, the host memory (114) may be a non-volatile memory.

In an embodiment, the processor (113) of the host device (112) may be configured to read Extended Card Specific Data (EXT_CSD) of an EXT_CSD register and/or Card Specific Data (CSD) of a CSD register from the memory device (102) via a host I/O interface block (116). For example, an eMMC device may include an EXT_CSD register, and an SD card and/or micro-SD card may include a CSD register. The processor (113) may be configured to transmit an auto-tuning request via the line (118) to the memory device (102) by generating a command (CMD) upon reading the EXT_CSD or CSD register. The processor (113) may be configured to receive a response to the transmitted auto-tuning CMD via the common line (118).

The host controller (115) further includes the host Input/Output (I/O) interface block (116). The host Input/Output (I/O) interface block (116) is coupled with the processor (113) through which an input signal and/or an output signal is transmitted from and/or to the memory device (102), respectively, via the common line (118) configured for the command and the response, and via the data bus line (119). The input signal and the output signal may represent data received by the host device (112) and data transmitted by the host device (112), respectively. In an embodiment, the host device (112) may be configured to receive and transmit data via the host Input/Output (I/O) interface block (116) using a bidirectional data bus line (119). For example, the bidirectional data bus line (119) may include eight (8) data bus lines DAT[7:0] or four data bus lines DAT[3:0] used to communicate data signals to and from the memory device (102). The received data may comprise auto-tuning support information that is stored in the EXT_CSD and/or CSD register (110) of the memory device (102), a response to a SEND_EXT_CSD CMD or a SEND_CSD CMD, a response to an auto-tuning bit enabling request, a response to an auto-tuning request, or the like. The transmit data may comprise checking for an auto-tuning support option in the memory device (102) by transmitting a SEND_EXT_CSD CMD or a SEND_CSD CMD, transmitting a SEND_EXT_CSD CMD or SEND_CSD CMD request to the memory device (102) to read a possible plurality of sets of tuning parameters supported by the memory device (102), transmitting an auto-tuning bit enabling request by transmitting a CMD6 SWITCH command, transmitting a tuning request by transmitting a tuning command CMD21 or CMD19, or the like.

The memory device (102) may include a memory controller (103) and at least one non-volatile flash memory unit (109). The memory controller (103) may include a memory device I/O interface block (104), a control logic block (105), and a flash I/O interface block (108). The control logic block (105) may include a Central Processing Unit (CPU) or processor (106), and a memory or buffer (107). The at least one flash memory unit (109) may include the EXT_CSD/CSD register (110) and firmware (111). The firmware (111) may include a data structure in which a plurality of sets of tuning parameters are stored. The processor (106) may execute the firmware (111) to control one or more operations of the components of the memory device (102). The controlled components of the memory device (102) may include the memory device I/O interface block (104), the memory or buffer (107), the flash I/O interface block (108), the at least one non-volatile flash memory unit (109) or the like. The one or more operations may include boot operations or post-boot operations. The memory or buffer (107) may be used to temporarily store read data and write data exchanged between the memory device I/O interface block (104) and the flash I/O interface block (108). The memory or buffer (107) may be implemented as a volatile memory (e.g., DRAM or SRAM).

In the memory controller (103), the processor (106) is coupled with the memory device I/O interface block (104), through which an input signal or/and an output signal is transmitted from and to the host device (112) via the common line (118) for the command and the response, and the data bus line (119). The input signal and the output signal may represent data received by the memory device (102) and data transmitted by the memory device (102), respectively. In an embodiment, the memory device (102) may be configured to receive and transmit data via the memory device Input/Output (I/O) interface block (104) using a bidirectional data bus line (119). For example, the bidirectional data bus line (119) may include eight (8) data lines DAT[7:0] or four data lines DAT[3:0] used to communicate data signals to and from the host device (112). The received data may comprise a SEND_EXT_CSD CMD or a SEND_CSD CMD to check for an auto-tuning support option, a receive SEND_EXT_CSD CMD or a SEND_CSD CMD request to send a possible plurality of sets of tuning parameters to the host device (112), a tuning bit enabling request (e.g., CMD6 is received), a tuning request (e.g., CMD 21/19 is received), or the like. The transmitted data may comprise tuning support information that is stored in the EXT_CSD or CSD register (110) of the memory device (102), a response to a SEND_EXT_CSD CMD or a SEND_CSD CMD request to send the possible plurality of sets of tuning parameters, a response to an auto-tuning bit enabling request, a response to auto-tuning request, or the like.

During a write operation, write data received from the host device (112) via the memory device I/O interface block (104) may be temporarily stored in the memory or buffer (107) under the control of the CPU (106). Thereafter, the flash I/O interface block (108) may retrieve the write data from the memory or buffer (107), and program the write data to the at least one non-volatile flash memory unit (109) under the control of the CPU (106). For instance, the write data may include enabling the auto-tuning bit in the SEND_EXT_CSD or SEND_CSD register, or the like.

During a read operation, the flash I/O interface block (108) may be used to move read data to be transmitted to the host device (112) retrieved from the at least one non-volatile flash memory unit (109) into the memory or buffer (107) under the control of the processor (106). For instance, the read data may include auto-tuning support information from the SEND_EXT_CSD or SEND_CSD register, the possible plurality of sets of the tuning parameters from the SEND_EXT_CSD or SEND_CSD register, or the like. For example, the flash I/O interface block (108) may be used to move auto-tuning support information and the possible plurality of sets of the tuning parameters provided from the SEND_EXT_CSD or SEND_CSD register to the memory or buffer (107) under the control of the CPU (106).

In an embodiment, the memory device (102) may include the one or more flash memory units. Each flash memory unit may include a plurality of pages. Each of the pages may include a plurality of memory cells to which a plurality of word lines (WL) are electrically coupled. In an embodiment, the host device (112) may communicate a hardware reset signal to the memory device (102) via a reset line. One or more voltage generating circuits in the host device (112) may be used to provide one or more operating voltages to the memory device (102). Such host-generated operating voltages may be communicated to the memory device (102) via one or more voltage lines.

Figure 2A:
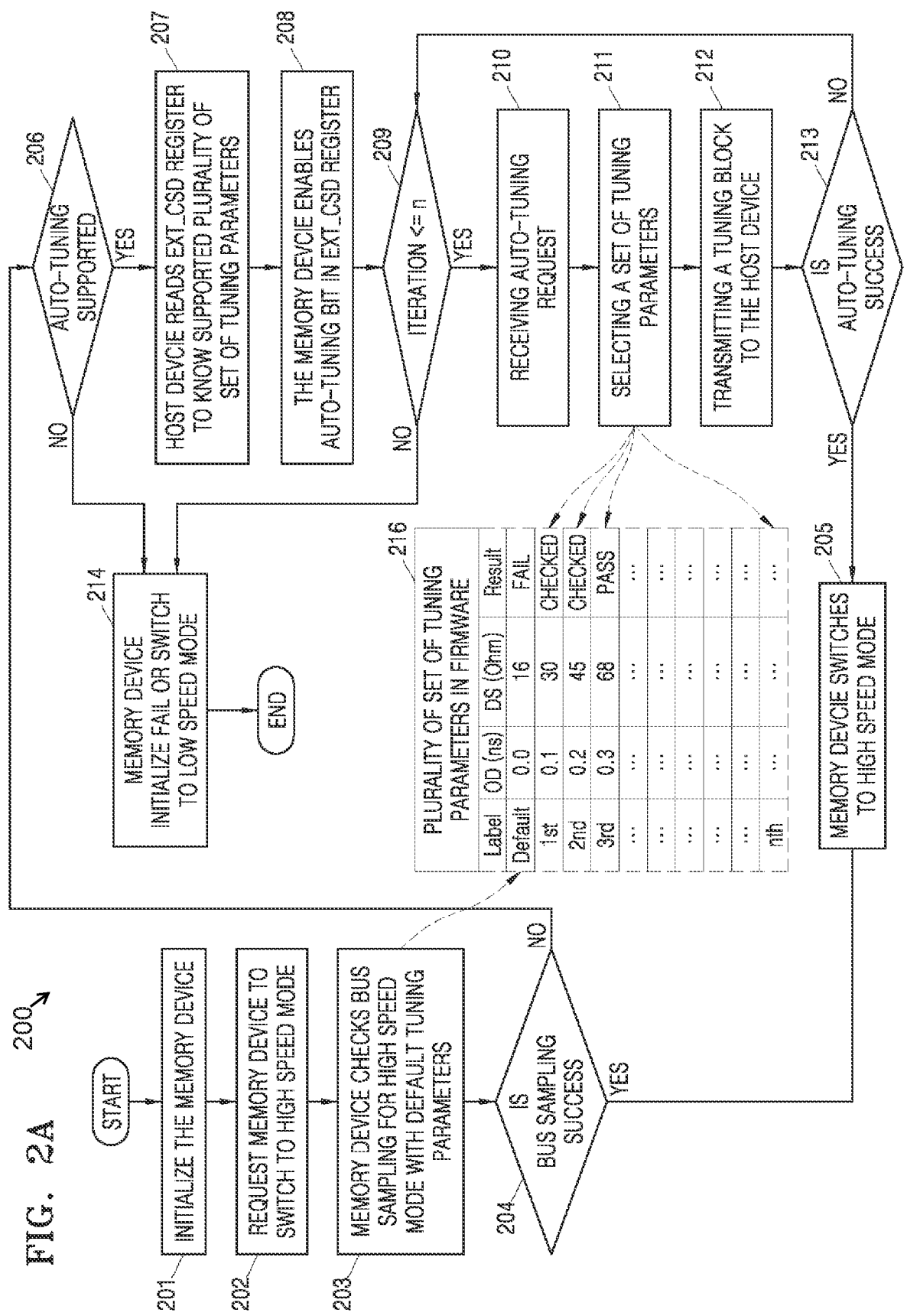
FIG. 2a is a flowchart diagram that shows a process for tuning a memory device for high-speed transitions in accordance with an embodiment of the present disclosure.

FIG. 2a shows a process for tuning a memory device for high-speed transitions, in accordance with an embodiment of the present disclosure. Upon the memory device I/O interface block (104) receiving the clock signal (117) CLK and a command CMD from the host device (112), the processor (106) analyzes the command CMD, generates an appropriate response RES, and communicates the response RES along with read data via command/response line (118) and one or more data bus line (119) to the host device (112). In an embodiment, the tuning indicates synchronization between the CLK signal and the response signal or data bus signal. When the host device (112) reads data from the memory device (102), the host device (112) sends the clock signal CLK to the memory device (102) through the clock line (117). The memory device (102) outputs the data in synchronization with the clock signal provided from the host device (112). Then the host device (112) takes the data signal in synchronization with the clock signal.

Steps 201 to 205 indicate tuning process steps performed by the memory device (102). Steps 206 to 215 indicate an auto-tuning process performed by the system (101) in accordance with an embodiment of the present disclosure. In an embodiment, the system (101) may include the host device (112) and the memory device (102) as an eMMC. In another embodiment, the system (101) may include the host device and the memory device (102) as an SD card or a micro-SD card. For instance, the steps 206 to 215 may be performed by the system (101) including the host device (112) and the memory device (102) as an eMMC.

At step 201, the host device (112) sends a hardware reset signal over a reset line or sends a CMD0 over the command line (118) to the memory device (102), such as an eMMC, for re-setting through the command/response line (118). The CMD0 command causes the memory device (102) to enter into a boot operation mode. If the eMMC does not support boot mode, or if the BOOT_PARTITION_ENABLE bit is cleared, the eMMC may immediately enter an idle state after power up. In the idle state, the eMMC may ignore transmissions unless a CMD1 is received from the host device (112). After the host device (112) sends the CMD1, a response to the CMD1 contains a busy signal status. An Operation Conditions Register (OCR) is associated with the memory device (102). If the Operation Conditions Register (OCR) busy bit is 0, this indicates that the eMMC is not ready yet and is still working on its power-up procedure and is not ready for identification. The busy bit essentially indicates a "busy state" for the eMMC to the host device (112). Once the busy bit is set to 1, this indicates that the eMMC is initialized and a corresponding response is transmitted to the host device (112). The host device requests the eMMC to SEND_EXT_CSD register by sending a CMD8 command signal via the command/response line (118). In response to the CMD8, the eMMC sends its EXT_CSD as a block of data via the data bus line (119). Using the CMD8, the host device (112) may check the eMMC capabilities and selected modes. The EXT_CSD register (110) defines the eMMC properties and selected modes. At step 202, upon eMMC initialization, the host device (112) sends a request to the eMMC to switch to a high-speed mode (e.g., 0-200 Megahertz (MHz)) by sending a switching command CMD6 via the command/response line (118). The eMMC checks and sets default tuning parameters from the firmware (111). At step 203, the eMMC performs bus sampling for high-speed mode with default tuning parameters upon receiving the tuning command CMD21 from the host device (112) via the command/response line (118). At step 204, the eMMC sends a response to the tuning command CMD21 via the command/response line (118). If tuning is successful, then the eMMC switches to the high-speed mode at 205. If tuning is unsuccessful with default tuning parameters, then the steps 206 to 215 are performed.

At step 206, the host device (112) may send a command SEND_EXT_CSD (CMD8) via the command/response line (118) to check whether auto-tuning is supported by the eMMC or not. In response to the SEND_EXT_CSD CMD, the eMMC sends its EXT_CSD as a block of data via the data bus line (119). Then the host device (112) is configured to read the auto-tuning support information from the received data related to the EXT_CSD register. Referring to FIG. 2b illustrating the structure of the EXT_CSD register (110), if a start bit BIT[0] of the EXT_CSD register is 0x1 then this indicates that the eMMC supports auto-tuning.

At step 207, the host device (112) again sends CMD8 to read the EXT_CSD register to determine the possible plurality of sets of tuning parameters supported by the eMMC. Referring to FIG. 2b, Bit[7:2] of the EXT_CSD register may include the possible plurality of sets of tuning parameters. Data structure (216) in the form of a table may include the plurality of sets of tuning parameters. The data structure (216) is stored in the firmware (111) of the memory device (102) such as an eMMC. During the boot operation mode, the plurality of sets of tuning parameters may be loaded to the EXT_CSD register. A set of tuning parameters may indicate an Output Delay (OD) value and a Driver Strength (DS) value.

At step 208, the host device (112) may send a switch command CMD6 to the eMMC to enable the auto-tuning bit in the EXT_CSD register. The eMMC sends a response to the CMD6 request via the common line (118) for command and response. The response indicates that the auto-tuning bit is enabled. For example, referring to FIG. 2b, Bit[1] of the EXT_CSD register indicates the auto-tuning bit. When Bit[1] is 1, this indicates that the auto-tuning bit is enabled, and when Bit[1] is 0, this indicates that the auto-tuning bit is disabled. When tuning has failed with the default tuning parameters at step 204, the auto-tuning process may be performed until one or more pre-defined conditions are satisfied. The one or more pre-defined conditions are indicated at steps 209 and 213. Here, the one or more pre-defined conditions may include one of the number of iterations being less than or equal to pre-defined count value, or a successful tuning result. The pre-defined count value may be 'n'. The number 'n' indicates an integer number such as 10, 12, 15, or the like. The pre-defined count value 'n' depicts a possible number of plurality of sets of tuning parameters present in the data structure (216). The iteration corresponds to the iteration count value which ranges from a minimum value to a maximum value. For instance, the minimum value is 1 and maximum value is 'n' which is similar to the pre-defined count value. The host device (112) reads the EXT_CSD register to determine the possible plurality of sets of tuning parameters supported by the eMMC at step 207. Based on this information, the host device (112) may be configured to send 'm' number of tuning requests to the eMMC. The number 'm' is an integer number such as 10, 12, 15, or the like. For example, the maximum value of 'n' may be 10 and the maximum value of 'm' may be 40. Thus, the host device (112) can send tuning requests to the eMMC for 'm' times, and correspondingly the auto-tuning bit Bit[1] may be set for 'n' times. Similarly, after auto-tuning with the set of tuning parameters from the plurality of sets of tuning parameters for each iteration (e.g., 1, 2, 3 . . . n), correspondingly the auto-tuning bit Bit[1] may be reset for each iteration.

Figure 2C:
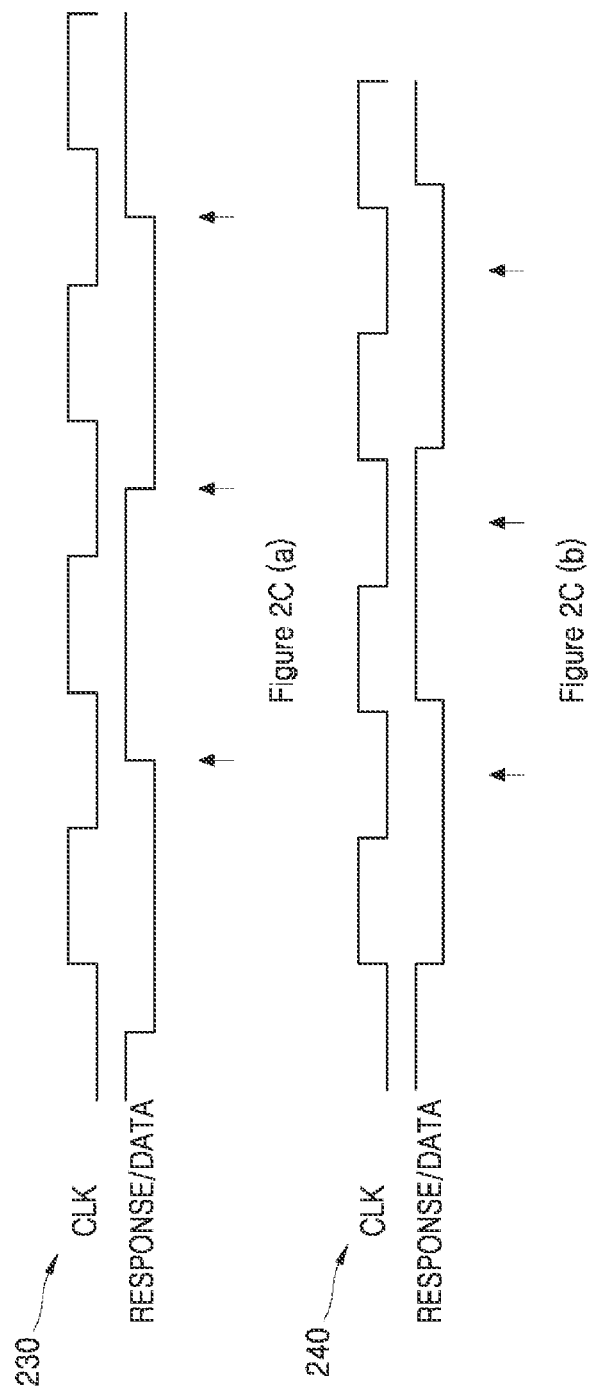
FIG. 2c is a timing diagram that shows a tuning result in accordance with an embodiment of the present disclosure.

Upon failure of the bus sampling tuning of the memory device (102) such as for an eMMC with default tuning parameters, the eMMC receives the tuning command CMD21 at step 210. The eMMC selects a set of tuning parameters indicated at the first label from the plurality of sets of tuning parameters stored in the data structure (216) at step 211. The eMMC sets the selected set of tuning parameters indicated at the first label as default parameters during a tuning process. Upon selecting the first set of tuning parameters, at 212 the eMMC transmits the tuning block to the host device (112) using the bus (118 and/or 119) based on the selected set of tuning parameters for tuning the memory device (102) for high-speed transitions. At step 210, the host device (112) transmits a "Send Tuning Block" command CMD21 to the memory device (102) such as an e.g., eMMC. The eMMC transmits the tuning block to the host device (112) using the bus (118 and/or 119) based on the selected set of tuning parameters as a response to the send Tuning Block command. In an embodiment, the host device (112) may include a comparison unit which is configured to compare the received tuning block from the memory device (102) with a predetermined or otherwise known tuning block pattern. The known tuning block pattern may be stored in the host memory (114) of the host device (112). The comparison unit may be configured to send a compared result to the processor (113) of the host device (112). The compared result indicates a difference between the received tuning block pattern and the predetermined tuning block pattern. Further, the processor (113) may be configured to detect an optimal sampling point the bus for CLK signal (117) by considering the compared result. The processor (113) may detect the optimal sampling point by adjusting the phase between memory device (102) CLK the host device (112) CLK based on the compared result. If the processor (113) detects the optimal sampling point for the memory device (102) CLK and the host device (112) CLK based on the compared result, then the tuning may be considered as successful. After the auto-tuning process is completed, data write and/or data read or the like operations may be performed. If the processor (113) does not detect the optimal sampling point for the memory device (102) CLK and the host device (112) CLK based on the compared result, then the tuning may be considered as unsuccessful. For example, referring to FIGS. 2c, 2c(a) and 2c(b) illustrate tuning results for the memory device (102), where FIG. 2c(a) indicates the CLK of the memory device (102) and the CLK of host device before tuning. FIG. 2c(b) indicates the CLK of the memory device (102) and the CLK of the host device (112) after the tuning process. The phase between the CLK of the memory device (102) and the CLK of the host device (112) is adjusted in FIG. 2c(b). Further, if tuning is unsuccessful, then the steps 208, 210, 211, and 212 may be repeated until the one or more pre-defined conditions are satisfied.

At step 211, for each iteration (e.g., 1, 2, 3 . . . n), the memory device (102) selects the set of tuning parameters from the plurality of sets of tuning parameters stored from the data structure (216). For example, referring to the data structure (216), during the $2^{nd}$ iteration the memory device (102) selects the set of tuning parameters indicated at the second label, during $3^{rd}$ iteration the memory device (102) selects the set of tuning parameters indicated at the third label, and during the nth iteration the memory device (102) selects the set of tuning parameters indicated at the nth label. Thus, the selected set of tuning parameters are indicated at the first label, second label, up to the nth label, respectively. During each iteration (e.g., e.g., 1, 2, 3 . . . n), each selected set of tuning parameters from the plurality of sets of tuning parameters are set as default parameters. Each selected set of tuning parameters from the plurality of sets of tuning parameters has a result status that is also updated after auto-tuning process. For example, when the auto-tuning process is checked with the first labeled set of tuning parameters and the second labeled set of tuning parameters, then the result status may be updated as checked. The result status as checked indicates that the auto-tuning process was performed but unsuccessful. When the auto-tuning process is checked with a third labeled set of tuning parameters, then the result status may be updated as passing after the auto-tuning process is successful. In an embodiment, consider for example that the auto-tuning is unsuccessful after performing the 'n' iterations, so then the memory device (102) may switch or fall back to work in the low-speed mode, or the memory device (102) may fail to initialize as shown at step 214.

In an embodiment, the system (101) may include the host device, and the memory device (102) implemented as an SD card or a micro-SD card. The steps 206 to 215 may be performed by the system (101) including the host device (112) and the memory device (102) implemented as one of an SD card or a micro-SD card using similar register fields as indicated in the EXT_CSD register (110). Register fields such as the auto-tuning support field, auto-tuning enabling field, and a possible OD/DS combinations field.

Figure 3:
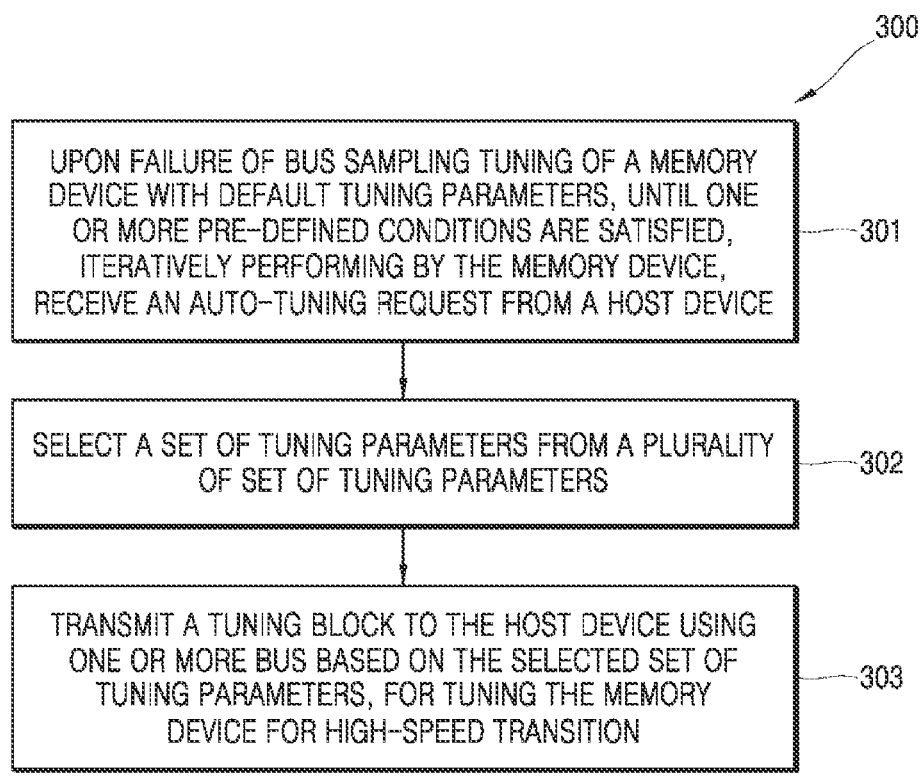
FIG. 3 is a flowchart diagram illustrating a method for tuning a memory device for high-speed transitions, in accordance with an embodiment of the present disclosure.

FIG. 3 shows a method for tuning a memory device (102) for high-speed transitions, in accordance with an embodiment of the present disclosure. The method steps are performed using the memory device (102). The memory device (102) may be one of an eMMC or an SD card or a micro-SD card. The order in which the method (300) may be described is not intended to be construed as a limitation, and any number of the described method blocks may be arranged or combined in any order to implement the method. Additionally, individual blocks may be deleted from the methods without departing from the spirit and scope of the subject matter described herein. Furthermore, the method may be implemented in any suitable hardware, software, firmware, or combination thereof.

Upon failure of high-speed tuning for the memory device (102) with default tuning parameters, step 301, step 302 and step 303 may be iteratively performed by the memory device (102) until one or more pre-defined conditions are satisfied. The one or more pre-defined conditions may include one of successful tuning or that the iteration is less than or equal to pre-defined count value.

At step 301, the processor (106) of the memory device (102) receives the tuning request CMD21 from the host device (112). The memory device (102) is configured to receive an auto-tuning request until one or more pre-defined conditions are satisfied. The one or more pre-defined conditions include one of successful tuning or that the iteration is less than or equal to pre-defined count value. The pre-defined count value may be 'n', where the number 'n' indicates an integer number such as 10, 12, 15, or the like. The pre-defined count value 'n' depicts a possible number of plurality of sets of tuning parameters present in the data structure (216). The iteration depicts the iteration count value which ranges from minimum value to maximum value. For instance, the minimum value is 1 and maximum value is 'n', which is similar to pre-defined count value. Upon failure of bus sampling mode tuning of the memory device with default tuning parameters, the host device (112) is configured to check whether or not the auto-tuning mode is supported by the memory device (102) by sending the CMD8 (SEND_EXT_CSD) command. In response to CMD8, the memory device (102) sends the contents of its EXT_CSD register. Then the host device (112) is configured to read auto-tuning support information from received data related to the EXT_CSD register. The host device (112) again sends the CMD8 to read the EXT_CSD register to determine a possible plurality of sets of tuning parameters supported by the eMMC. The host device (112) further sends the CMD6 command to the memory device (102) to set the auto-tuning bit in the EXT_CSD register. The memory device (102) sets the auto-tuning bit in the EXT_CSD register of the memory device (102) in response to each tuning request (e.g., 1,2, . . . n). The memory device (102) may be configured to re-set the EXT_CSD register after tuning with the set of tuning parameters from the plurality of sets of tuning parameters for each iteration (e.g., 1,2, . . . n).

At step 302, the processor (106) of the memory device (102) selects the set of tuning parameters from the plurality of sets of tuning parameters until one or more pre-defined conditions are satisfied. The selected set of tuning parameters during an iteration are set as the default parameters for the iteration. The plurality of sets of tuning parameters are stored in the data structure (216) associated with the firmware (111) of the memory device (102). The set of tuning parameters include an Output Delay (OD) value and a Driver Strength (DS) value.

At step 303, the processor (106) of the memory device (102) transmits the tuning block to the host device (112) using the bus (118 and/or 119) based on the selected set of tuning parameters for tuning the memory device (102) for high transitions. Upon receiving the tuning block from the memory device, the host device (112) is configured to detect an optimal sampling point by adjusting the host device (112) CLK for the bus based on the compared result (e.g., the difference between the received tuning block from the memory device (102) and the default tuning pattern of the host device (112)).

The terms "an embodiment", "embodiment", "embodiments", "the embodiment", "the embodiments", "one or more embodiments", "some embodiments", and "one embodiment" shall mean "one or more, but not necessarily all, embodiments of the present disclosure the present disclosure", unless expressly specified otherwise.

The terms "including", "comprising", "having" and variations thereof shall mean "including but not limited to", unless expressly specified otherwise.

The enumerated listing of items does not imply that any or all of the items are mutually exclusive, unless expressly specified otherwise. The terms "a", "an" and "the" shall mean "one or more", unless expressly specified otherwise.

A description of an embodiment with several components in communication with each other does not imply that all such components are required. On the contrary, a variety of optional components are described to illustrate the wide variety of possible embodiments of the present disclosure.

When a single device or article is described herein, it may be readily apparent that more than one device/article (whether or not they cooperate) may be used in place of a single device/article. Similarly, where more than one device or article is described herein (whether or not they cooperate), it may be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present disclosure need not include the particular device itself.

The illustrated operations of FIG. 3 show certain operations and/or events occurring in a certain order. In alternative embodiments, certain operations may be performed in a different order, modified, or removed. Moreover, steps may be added to the above-described logic and still conform to the described embodiments. Further, operations described herein may occur sequentially, or certain operations may be processed in parallel. Yet further, operations may be performed by a single processing unit or by distributed processing units.

Moreover, the language used in the specification has been principally selected for readability and instructional purposes, and it may not have been selected to delineate or circumscribe the inventive subject matter. It is therefore intended that the scope of the present disclosure be limited not by this detailed description, but rather by the claims that issue on an application based here on. Accordingly, the disclosure of embodiments of the present disclosure is intended to be illustrative, but not limiting, of the scope of the inventive concept, which is set forth in the following claims. While various aspects and embodiments have been disclosed herein, other aspects and embodiments may be apparent to those of ordinary skill in the pertinent art. The various aspects and embodiments disclosed herein are for purposes of illustration and are not intended to be limiting, with the true scope and spirit being indicated by the following claims.

We claim:

1. A method for tuning a memory device for high-speed transitions, the method comprising:
   receiving, by the memory device, a signal indicative of a failure of a bus sampling tuning of the memory device with default tuning parameters;
   setting, by the memory device, an auto-tuning bit in a Card-Specific Data (CSD) register of the memory device in response to each auto-tuning request;
   iteratively performing, by the memory device, at least the following steps until at least one pre-defined condition is satisfied:
      receiving, by the memory device, an auto-tuning request from a host device;

selecting, by the memory device, a set of tuning parameters from a plurality of sets of tuning parameters; and transmitting, by the memory device, a tuning block to the host device using the bus, wherein the tuning block is based on the selected set of tuning parameters for tuning the memory device for high-speed transitions.

2. The method as claimed in claim 1, wherein the at least one pre-defined condition includes at least one of a successful tuning condition or a number of iterations equal to a pre-defined count value condition.

3. The method as claimed in claim 1, wherein parameters of the selected set of tuning parameters during an iteration are set as default parameters for the iteration.

4. The method as claimed in claim 1, comprising:
re-setting, by the memory device, the auto-tuning bit in the CSD register after tuning with the set of tuning parameters from the plurality of sets of tuning parameters for each iteration.

5. The method as claimed in claim 1, wherein the plurality of sets of tuning parameters are stored in a data structure associated with firmware of the memory device.

6. The method as claimed in claim 1, wherein the set of tuning parameters includes an Output Delay (OD) value and a Driver Strength (DS) value.

7. A memory device comprising:
at least one non-volatile flash memory unit;
a processor configured, upon failure of a bus sampling tuning of the memory device with default tuning parameters until one or more pre-defined condition are satisfied, to iteratively:
receive an auto-tuning request from a host device;
set an auto-tuning bit in a Card-Specific Data (CSD) register of the memory device in response to each auto-tuning request;
select a set of tuning parameters from a plurality of sets of tuning parameters; and
transmit a tuning block to the host device using the bus based on the selected set of tuning parameters, for tuning the memory device for high-speed transitions.

8. The memory device as claimed in claim 7, wherein the processor determines the one or more pre-defined conditions as one of a successful tuning condition or an iteration equal to a pre-defined count value condition.

9. The memory device as claimed in claim 7, wherein the processor is configured to set the selected set of tuning parameters as default parameters.

10. The memory device as claimed in claim 7, wherein the processor is configured to:
re-set the auto-tuning bit in the CSD register after tuning with the set of tuning parameters from the plurality of sets of tuning parameters for each iteration.

11. The memory device as claimed in claim 7, wherein the at least one non-volatile flash memory unit is configured to store the plurality of sets of tuning parameters in a data structure associated with firmware of the memory device.

12. A system for tuning a memory device for high-speed transitions, the system comprises:

a memory device,
and a host device;
wherein the host device is configured, upon failure of a bus sampling tuning of a memory device with default tuning parameters, to transmit an auto-tuning request to the memory device until at least one pre-defined condition is satisfied,
wherein the memory device is configured to, iteratively:
receive the auto-tuning request from the host device;
set an auto-tuning bit in a Card-Specific Data (CSD) register of the memory device in response to each auto-tuning request;
select a set of tuning parameters from a plurality of sets of tuning parameters; and
transmit a tuning block to the host device using the bus based on the selected set of tuning parameters for tuning the memory device for high-speed transitions.

13. The system as claimed in claim 12,
wherein the tuning block is based on the selected set of tuning parameters for tuning the memory device for high-speed transitions,
wherein the at least one pre-defined condition includes at least one of a successful tuning condition or a number of iterations equal to a pre-defined count value condition;
wherein parameters of the selected set of tuning parameters during an iteration are set as default parameters for the iteration.

14. The system as claimed in claim 12, wherein the memory device is further configured for:
re-setting the auto-tuning bit in the CSD register after tuning with the set of tuning parameters from the plurality of sets of tuning parameters for each iteration.

15. The system as claimed in claim 12,
wherein the plurality of sets of tuning parameters are stored in a data structure associated with firmware of the memory device,
wherein the set of tuning parameters includes an Output Delay (OD) value and a Driver Strength (DS) value.

16. The system as claimed in claim 12, the memory device comprising:
at least one non-volatile flash memory unit; and
a processor connected to the at least one non-volatile flash memory unit.

17. The system as claimed in claim 16, wherein the processor is configured to determine the one or more pre-defined conditions as one of a successful tuning condition or an iteration equal to a pre-defined count value condition.

18. The system as claimed in claim 16, wherein the processor is configured to set the selected set of tuning parameters as default parameters.

19. The system as claimed in claim 16, wherein the processor is configured to:
re-set the auto-tuning bit in the CSD register after tuning with the set of tuning parameters from the plurality of sets of tuning parameters for each iteration.

20. The system as claimed in claim 16, wherein the at least one non-volatile flash memory unit is configured to store the plurality of sets of tuning parameters in a data structure associated with firmware of the memory device.

* * * * *